United States Patent
Fischer et al.

(10) Patent No.: US 8,884,178 B2
(45) Date of Patent: Nov. 11, 2014

(54) METHODS AND APPARATUS FOR IGNITING AND SUSTAINING PLASMA

(75) Inventors: Andreas Fischer, Castro Valley, CA (US); Neil Martin Paul Benjamin, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 184 days.

(21) Appl. No.: 12/908,462

(22) Filed: Oct. 20, 2010

(65) Prior Publication Data

US 2012/0097647 A1 Apr. 26, 2012

(51) Int. Cl.
*B23K 10/00* (2006.01)
*H05H 1/46* (2006.01)
*H01J 37/32* (2006.01)
*B23K 9/013* (2006.01)

(52) U.S. Cl.
CPC .................. *B23K 10/00* (2013.01); *H05H 1/46* (2013.01); *H01J 37/3211* (2013.01); *B23K 2201/40* (2013.01); *H01J 37/321* (2013.01); *B23K 9/013* (2013.01); *H01J 37/32825* (2013.01); *H05H 2001/4667* (2013.01); *H01J 37/32366* (2013.01)
USPC ............ 219/121.48; 219/121.43; 219/121.52; 118/723 I; 156/345.48

(58) Field of Classification Search
CPC .................................. B23K 10/00; H05H 1/30
USPC ............... 219/121.4, 121.43, 121.52, 121.59; 315/111.51; 118/723 I; 156/345.38, 156/345.48
See application file for complete search history.

(56) References Cited

U.S. PATENT DOCUMENTS

| | | | |
|---|---|---|---|
| 2,931,850 A | 4/1960 | Wreford et al. | |
| 3,084,299 A | 4/1963 | Lord et al. | |
| 3,142,809 A | 7/1964 | Remenyik et al. | |
| 5,476,229 A | 12/1995 | Ishikawa et al. | |
| 5,650,032 A * | 7/1997 | Keller et al. | 156/345.48 |
| 6,028,285 A * | 2/2000 | Khater et al. | 219/121.43 |
| 6,297,595 B1 * | 10/2001 | Stimson et al. | 315/111.51 |
| 6,320,320 B1 * | 11/2001 | Bailey et al. | 315/111.51 |
| 6,353,206 B1 * | 3/2002 | Roderick | 219/121.52 |
| 6,873,112 B2 * | 3/2005 | Wilcoxson et al. | 315/111.51 |
| 7,019,253 B2 * | 3/2006 | Johnson et al. | 219/121.36 |
| 7,631,828 B2 | 12/2009 | Horiguchi et al. | |
| 8,277,604 B2 * | 10/2012 | Howald et al. | 156/345.48 |

(Continued)

FOREIGN PATENT DOCUMENTS

GB 1114013 5/1968

OTHER PUBLICATIONS

"International Search Report", PCT Application No. PCT/US2011/056853, Mailing Date: Feb. 10, 2012.

(Continued)

*Primary Examiner* — Mark Paschall
(74) *Attorney, Agent, or Firm* — Martine Penilla Group, LLP

(57) ABSTRACT

Atmospheric inductively coupled plasma torch comprising a vessel within which the plasma is generated and a coil wound around the periphery of the vessel. The coil has at least two spaced-apart winding layers. The coil is constructed such that all winding layers of a given multi-turn is wound before an adjacent multi-turn is wound. A first end of the coil is coupled to ground, and a second end of the coil is coupled to receive a RF driver signal that is configured to ignite the plasma to facilitate processing.

20 Claims, 3 Drawing Sheets

(56) References Cited

U.S. PATENT DOCUMENTS

2001/0022158 A1*  9/2001  Brcka ................... 118/723.001
2001/0042594 A1* 11/2001  Shamouilian et al. ........ 156/345
2011/0094997 A1*  4/2011  Yamazawa et al. ............. 216/68

OTHER PUBLICATIONS

"Written Opinion", PCT Application No. PCT/US2011/056853, Mailing Date: Feb. 10, 2012.

* cited by examiner

METHODS AND APPARATUS FOR IGNITING AND SUSTAINING PLASMA

BACKGROUND OF THE INVENTION

In the manufacture of semiconductor products, substrates such as wafers undergo deposition and etching processes to form features thereon. The processing of semiconductor substrates often leaves residues, such as polymer deposition, between processing steps. Atmospheric inductively coupled plasma torches have been employed to clean substrates in preparation for further processing.

To facilitate discussion, FIG. 1 shows a typical prior art atmospheric inductively coupled plasma torch 100, which includes a double-wall cylinder 102. Cylinder 102 is typically formed out of quartz or a similarly suitable material. A cooling gas inlet 104 permits a cooling gas, such as nitrogen or air for example, to be injected in between the cylinder walls to thermally regulate double-wall cylinder 102 during use. By employing an appropriate cooling gas, thermal damage to atmospheric inductively coupled plasma torch 100 due to the high heat dissipation from the plasma therein is prevented.

A coil 106 is shown wrapped around the outer periphery of double-wall cylinder 102. During use, a process gas (e.g., hydrogen or nitrogen) is introduced into the interior volume of cylinder 102 through process gas inlet 108. When an appropriate driver RF signal (e.g., at 40 MHz) is supplied to coil 106, coil 106 acts as part of a series LC resonance circuit to ignite a plasma from the process gas. To help cool coil 106 during use, liquid cooling is typically employed.

The inductively coupled plasma formed within atmospheric inductively coupled plasma torch 100 is ejected from opening 120. The hot jet of plasma or activated neutral species ejected from opening 120 may then be employed to remove or clean materials, such as unwanted polymer deposition after an ion implantation process, from substrates.

As is known, the induced voltage on coil 106 is a function of the frequency of the driver RF signal. At 40 MHz, a typical atmospheric inductively coupled plasma torch may experience up to 20 KV (peak-to-peak) between the ends of coil 106, for example. The high induced voltage is necessary for igniting plasma at typical atmospheric conditions.

However, the high RF driver frequency employed in the prior art (e.g., 40 MHz or higher) presents cost and engineering challenges. For example, many processing systems already employ lower-frequency RF sources (e.g., 10-30 MHz, such as 13.56 MHz or 27.12 MHz) for etching and deposition. Accordingly, components and expertise for designing, manufacturing, qualifying, and maintaining lower-frequency subsystems are readily available at lower cost. Further, tool-to-tool repeatability is improved when a lower driver RF frequency is employed.

The invention relates to methods and apparatus for igniting and sustaining plasma at a lower driver RF frequency in an atmospheric inductively coupled plasma torch.

BRIEF DESCRIPTION OF THE DRAWINGS

The present invention is illustrated by way of example, and not by way of limitation, in the figures of the accompanying drawings and in which like reference numerals refer to similar elements and in which.

To facilitate discussion.

DETAILED DESCRIPTION OF THE PREFERRED EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As discussed earlier, the induced voltage on the coil that functions as part of a series LC resonance circuit is a function of the driver RF frequency. Lowering the driver RF frequency has the effect of lowering the induced voltage on the coil. Unless compensation is made, the lower induced voltage may be insufficient to ignite the plasma in an atmospheric inductively coupled plasma torch.

As is known, the induced voltage on the coil is also a function of the coil inductance, or L. Generally speaking, increasing the inductance of such a coil has the effect of increasing the induced voltage on the coil. By increasing the coil's inductance, a high induced voltage may be maintained even if the driver RF frequency is lowered. Alternatively, a higher induced voltage may be achieved if the driver RF frequency remains the same.

One way to increase the coil's inductance is by increasing the number of turns. Generally speaking again, the inductance of a cylindrical coil is proportional to the square of the number of turns. For example, for a cylindrical coil geometry (solenoid) and without considering the ends of the coil, dropping the driver RF frequency by a factor of 3 (e.g., going from 40 MHz to 13 MHz) would require compensation in the form of a 1.7× increase on the number of turns with 1.7 being roughly the square root of 3) to maintain roughly the same induced voltage across the coil.

Figure 1:
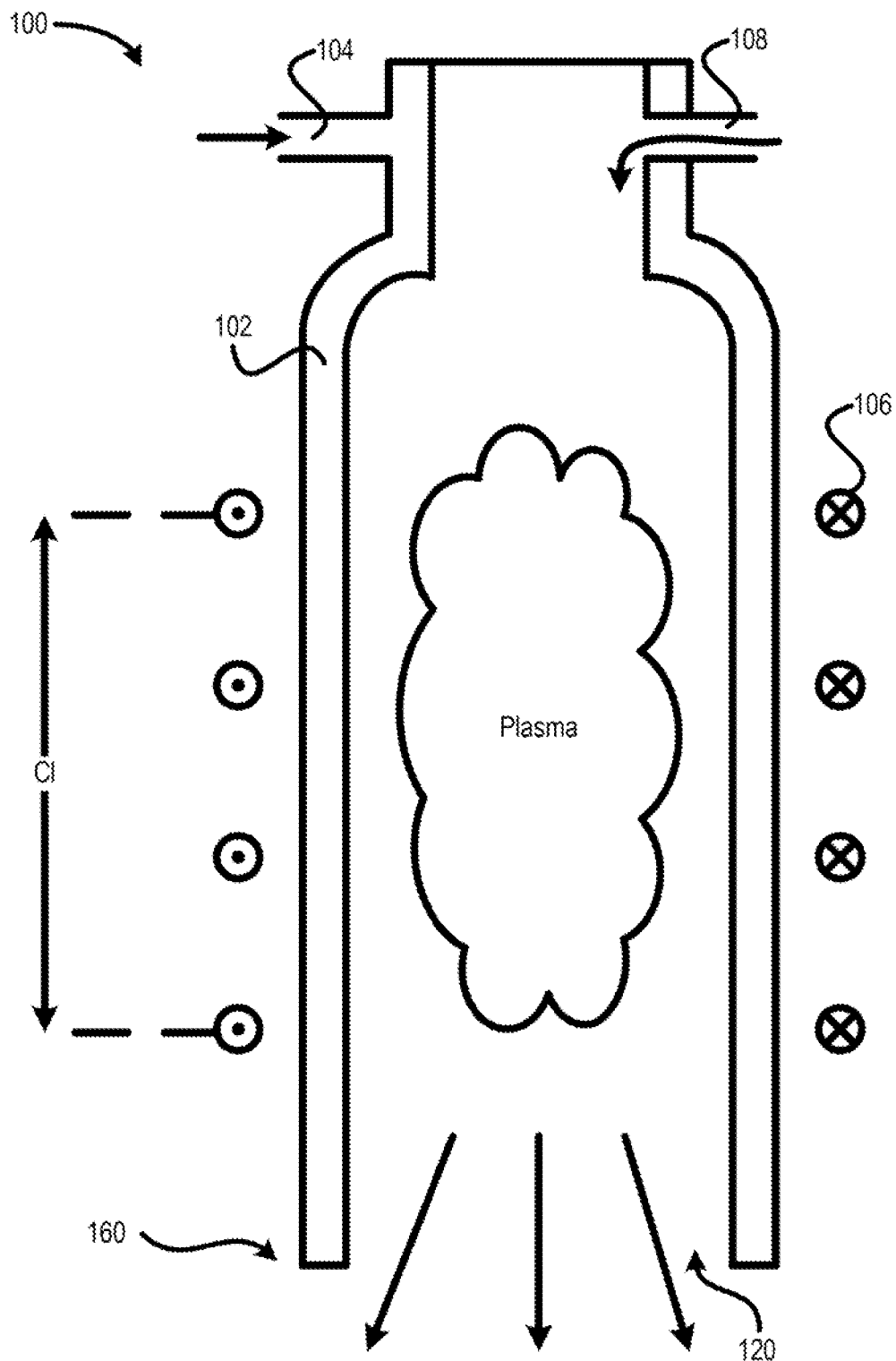
FIG. 1 shows a typical prior art atmospheric inductively coupled plasma torch.

However, it is realized by the inventors herein that increasing the number of turns of the coil by simply adding more windings presents other problems. With reference to FIG. 1, for example, the plasma length and other plasma characteristics are directly or indirectly affected when the coil length (CL in FIG. 1) is increased. For many applications, the changes in the plasma length and in other plasma characteristics are undesirable. Even if the change in the plasma length and other plasma characteristics can be accommodated, there is a physical limit to the number of turns that can be added since form factor requirements may prevent the atmospheric inductively coupled plasma torch from exceeding a certain length or bulk, for example.

In the transformer art, it is known that the number of turns of a coil can be effectively increased by utilizing a multi-layer coil. In a two-layer coil of the type typically employed in transformers, for example, an outer coil layer of 100 turns may overlay an inner coil layer of 100 turns, effectively providing a coil with an effective number of turns greater than 100 without increasing the coil length.

However, the inventors herein realize that the atmospheric inductively coupled plasma torch application involves arcing risks that are not typically experienced in transformer coil designs. As discussed earlier, the induced voltage between the ends of the coil may approach multiple tens of thousands of volts to effectively ignite plasma at atmospheric conditions. If two coil layers are wound such that the coil ends are spatially close to one another, arcing may occur.

Suppose, for example, the winding for the first coil layer end may start at an arbitrary point X on the quartz cylinder, proceeds toward point Y as it is wound around the quartz cylinder to form an inner coil layer, advances from the inner coil layer to the outer coil layer at point Y, and is wound back toward point X on the quartz cylinder to form the other end of the coil. At this stage, both ends of the coil are near point X. If the voltage difference between the two ends of the coil exceeds the breakdown voltage of the medium situated between the two coil ends (typically air), it is possible that arcing may occur between both coil ends due to the high voltage difference and the closeness of both coil ends.

Embodiments of the invention relate to methods and apparatus for maintaining a plasma-ignition capable voltage on the coil of an atmospheric inductively coupled plasma torch without increasing the physical length of the coil or unduly increasing its bulk while minimizing arcing damage. The coil discussed herein represents the coil that is wound around the cylinder or vessel (since it's possible to have a non-cylindrical vessel) that is used to generate and contain the plasma. In various embodiments, novel winding patterns (and methods therefor) are provided to minimize the voltage difference between adjacent multi-turns. As the term is employed herein, a multi-turn refers to multiple (at least two) turns that are wound on top of one another and are wound continuously from the bottom turn to the top turn or vice versa.

In one or more embodiments, novel winding patterns (and methods therefor) keep the voltage difference between adjacent multi-turns to a few thousand volts (as compared to tens of thousands) to minimize arcing. In one or more embodiments, novel winding patterns (and methods therefor) keep the ends of the coil (i.e., the parts of the coil that experience the highest voltage difference) more physically separated than possible in the prior art to minimize arcing.

Generally speaking, the coil is wound such that all winding layers of a single multi-turn are completed before proceeding to the next multi-turn. One variation relates to whether the winding starts at the lowest (inner-most or closest to the cylinder) winding layer for the first turn of a multi-turn or at the uppermost (outer-most or furthest from the cylinder) winding layer for the first turn of the multi-turn. Another variation occurs in whether the cross-over from a multi-turn to its adjacent multi-turn occurs at the same winding layer (e.g., the cross-over is made from upper-most layer of multi-turn X to upper-most layer of multi-turn X+1, or the cross-over is made from lowest layer of multi-turn X to lowest layer of multi-turn X+1) or at a different winding layer (e.g., the cross-over is made from upper-most layer of multi-turn X to lowest layer of multi-turn X+1, or the cross-over is made from lowest layer of multi-turn X to upper-most layer of multi-turn X+1).

In the following discussion, a two-layer coil is described. However, it should be understood that the apparatus and methods herein can be extended to 3-layer, 4-layer or more by simply performing the windings for all layers of a multi-turn before starting on an adjacent multi-turn, for example.

In one or more embodiments, a LULU (lower-upper-lower-upper) winding pattern is formed between the first two adjacent multi-turns in a two-layer coil. The pattern repeats for the next two multi-turns, and for the next two, and so forth. The LULU pattern involves first winding the coil close to the plasma cylinder (the lower layer, which is the "L" part of the LULU pattern). This represents the first "L" in the pattern "LULU". Next, the winding is done for the upper layer radially further away from the plasma cylinder in the same multi-turn. This represents the first "U" in the pattern "LULU". These two windings (lower layer, then upper layer) form the first multi-turn (which happens to be double-turn for a two-layer coil). It should be noted that both individual turns or wraps of an L-U double-turn are located at the same distance d1 with respect to the end 160 of the quartz cylinder.

Next, the coil is led to the lower layer of the adjacent multi-turn, again close to the plasma cylinder. This represents the second "L" in the pattern "LULU". Next, the winding is done for the upper layer radially further away from the plasma cylinder in the same adjacent multi-turn. This represents the second "U" in the pattern "LULU". These two windings (lower layer, then upper layer) form the second double-turn. The second double-turn is located at a sufficiently different distance d2 (measured with respect to the end 160 of the quartz cylinder) to minimize cross talk with L-U pair 1 at distance d1. The third double-turn and fourth double-turn proceed similarly.

It should be noted that if three layers are involved, the pattern simply becomes "$L_1 U_{11} U_{12} L_2 U_{21} U_{22}$", for example, where the designation $L_1$ represents the lowest layer that is closest to the cylinder for the first triple turn, the designation $U_{11}$ denotes the intermediate layer for the first triple turn and designation $U_{12}$ denotes the upper most layer that is radially the furthest away from the cylinder for the first triple turn. Analogously, the designation $L_2$ represents the lowest layer that is closest to the cylinder for the second triple turn, the designation $U_{21}$ denotes the intermediate layer for the second triple turn and designation $U_{22}$ denotes the upper most layer that is radially the furthest away from the cylinder for the second triple turn. In this case, the lower layer is wound first, and then the intermediate upper layer radially further out for the same triple turn is wound. Afterward, the upper-most layer that is radially even further out is wound for the same triple turn. The coil is then led to the lower layer of the adjacent triple turn to repeat. If four layers are involved, the pattern becomes "$L_1 U_{11} U_{12} U_{13} L_2 U_{21} U_{22} U_{23}$", for example. In this manner, any number of layers may be accommodated.

Also note that it is possible to wind a ULUL pattern for the first two adjacent multi-turns in a two-layer coil. In other words, it is possible to wind upper and lower for one multi-turn, cross-over, and wind upper and lower for the adjacent multi-turn. The pattern repeats for the next two multi-turns, and for the next two, and so forth. For three layers, it becomes "$U_1 L_{11} L_{12} U_2 L_{21} L_{22}$", for example, where the designation $U_1$ represents the upper most layer for the first triple turn, the designation $L_{12}$ denotes the intermediate layer for the first triple turn and designation $L_{12}$ denotes the lowest layer that is closest to the cylinder for the first triple turn. Analogously, the designation $U_2$ represents the upper most layer for the second triple turn, the designation $L_{21}$ denotes the intermediate layer for the second triple turn and designation $L_{22}$ denotes the lowest layer that is closest to the cylinder for the second triple turn.

In one or more embodiments, a LUUL (lower-upper-upper-lower) winding pattern is formed between the first two adjacent multi-turns in a two-layer coil. The pattern repeats for the next two multi-turns, and for the next two, and so forth. The LUUL pattern involves first winding the coil layer close to the plasma cylinder. This represents the first "L" in the pattern "LUUL". Next, the winding is done for the upper layer radially further away from the plasma cylinder in the same multi-turn. This represents the first "U" in the pattern "LUUL". These two windings (lower layer, then upper layer) form the first multi-turn.

Next, the coil is crossed over to the upper layer of the adjacent multi-turn. This represents the second "U" in the pattern "LUUL". Next, the winding is done for the lower layer closer to the plasma cylinder in the same adjacent multi-turn. This represents the second "L" in the pattern "LUUL". These two windings (lower layer, then upper layer) form the second multi-turn. The third and fourth multi-turns proceed similarly.

It should be noted that if three layers are involved, the pattern simply becomes "$L_1U_{11}U_{12}U_{21}L_2$" for the first pair of adjacent multi-turns, for example, where the designation $L_1$ represents the lowest layer that is closest to the cylinder for the first double turn, the designation $U_{11}$ denotes the intermediate layer for the first double turn and designation $U_{12}$ denotes the upper most layer that is radially the furthest away from the cylinder for the first double turn. Analogously, the designation $L_2$ represents the lowest layer that is closest to the cylinder for the second double turn, the designation $U_{21}$ denotes the intermediate layer for the second double turn and designation $U_{22}$ denotes the upper most layer that is radially the furthest away from the cylinder for the second double turn. In this case, the lower layer is wound first, and then the intermediate upper layer radially further out for the same multi-turn is wound. Afterward, upper-most layer that is radially even further out is wound for the same multi-turn. The coil is then led to the upper-most layer of the adjacent multi-turn. Next, the intermediate upper layer of that adjacent multi-turn is wound. Next, the lower layer of that adjacent multi-turn is wound. If four layers are involved, the pattern becomes "$L_1U_{11}U_{12}U_{13}U_{23}U_{22}U_{21}L_2$", for example. In this manner, any number of layers may be accommodated.

Also note that it is possible to wind a ULLU pattern for the first two adjacent double turns in a two-layer coil. In other words, it is possible to wind upper and lower for one multi-turn, cross-over, and wind lower and upper for the adjacent multi-turn. The pattern repeats for the next two multi-turns, and for the next two, and so forth. For three layers, it becomes "$U_1L_{11}L_{12}L_{22}L_{21}U_2$", for example, where the designation $U_1$ represents the upper most layer for the first triple turn, the designation $L_{11}$ denotes the intermediate layer for the first triple turn and designation $L_{12}$ denotes the lowest layer that is closest to the cylinder for the first triple turn. Analogously, the designation $U_2$ represents the upper most layer for the second triple turn, the designation $L_{21}$ denotes the intermediate layer for the second triple turn and designation $L_{22}$ denotes the lowest layer that is closest to the cylinder for the second triple turn In one or more embodiments, the winding employs a continuous conductor and follows a single direction (i.e., either clock-wise or counter-clockwise) and proceeds until all winding layers of a single multi-turn is completed. Then the winding proceeds to the next multi-turn and completes all winding layers of the next multi-turn. Then the winding proceeds to the next multi-turn and so on. Multi-turns are added linearly in one direction along the linear length of the cylinder as adjacent multi-turns are added. In one or more embodiments, the grounded end of the coil is at an outer-most winding. Alternatively or additionally, in one or more embodiments, the high voltage end of the coil is at an outer-most winding. In one or more embodiments, 2-6 mm copper or copper alloy tubing is employed as coil material. The outer surface can be silver plated for better conductivity at high RF frequencies (skin effect of RF current).

In one or more embodiments of the invention, the coil is a tube-in-a-tube configuration in which a smaller tube is disposed inside a larger tube through the use of a double wall tube (with appropriate spacer structures in between). A cooling fluid (such as high-purity water or a similarly suitable cooling fluid) is injected into one tube (either the inner or outer tube) at one end of the coil, travels to the other end of the coil in the same tube, and is diverted into the other tube for returning to the original end of the coil. This configuration simplifies plumbing installation and maintenance. If the coil end that is employed to inject and extract the cooling fluid is also the grounded coil end, tap water or other 'none high-purity' cooling fluids may be used for cooling since the cooling fluid is not introduced into or extracted from the high voltage coil end. Introducing or extracting the cooling fluid at the grounded side avoids RF current leakage to undesirable locations in the plasma torch device due to a residual conductivity of the cooling fluid.

Figure 2A:
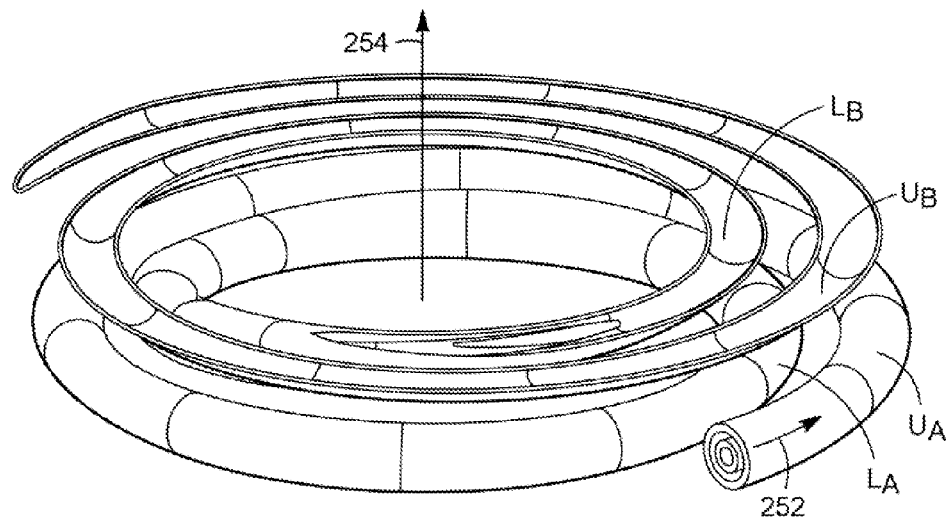
FIG. 2A-2D show cut-away drawings of an example improved 2-layer coil that employs the ULLU winding pattern.

The features and advantages of the invention may be better understood with reference to the figures and discussions that follow. FIG. 2A-2D show cut-away drawings of an example improved 2-layer coil that employs the ULLU winding pattern. In FIG. 2A, $U_A$ and $L_A$ form the first multi-turn, and then $L_B$ and $U_B$ form the adjacent multi-turn. $U_A$ represents the upper (outer) layer of the first multi-turn. $L_A$ represents the lower (inner) layer of the first multi-turn. $L_B$ represents the lower (inner) layer of the second multi-turn. $U_B$ represents the upper (outer) layer of the second multi-turn. In this example, the sequence is $U_AL_AL_BU_B$. Note that the coil is wound continuously clockwise (looking up from the bottom of the coil in the figure) in the direction of arrow 252 and proceeds in the direction of arrow 254 as additional multi-turns are added.

Figure 2B:
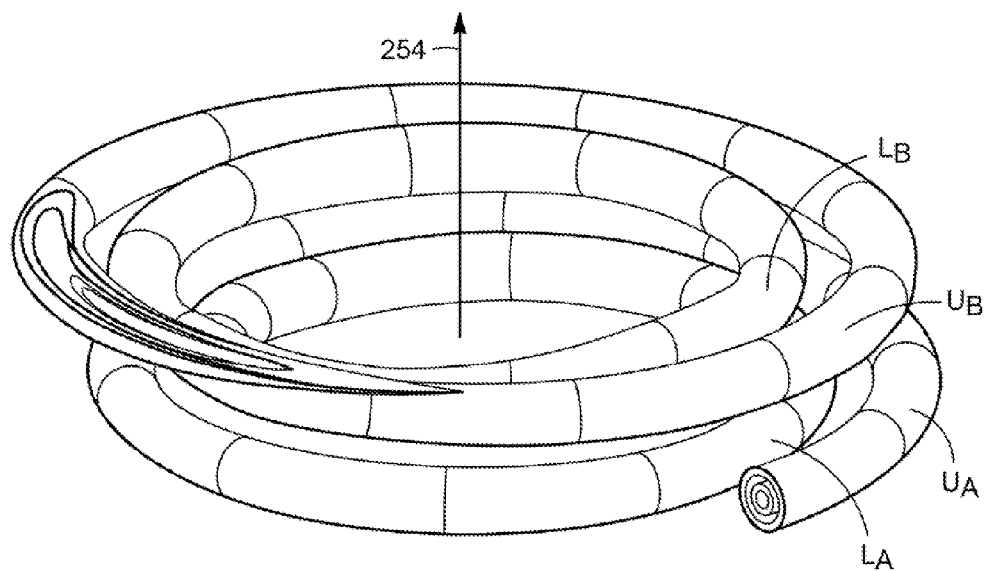

FIG. 2B represents the continuation of the ULLU winding pattern of FIG. 2A with the second multi-turn pair shown in more details. Again, $U_A$ and $L_A$ form the first multi-turn, and $L_B$ and $U_B$ form the adjacent multi-turn.

Figure 2C:
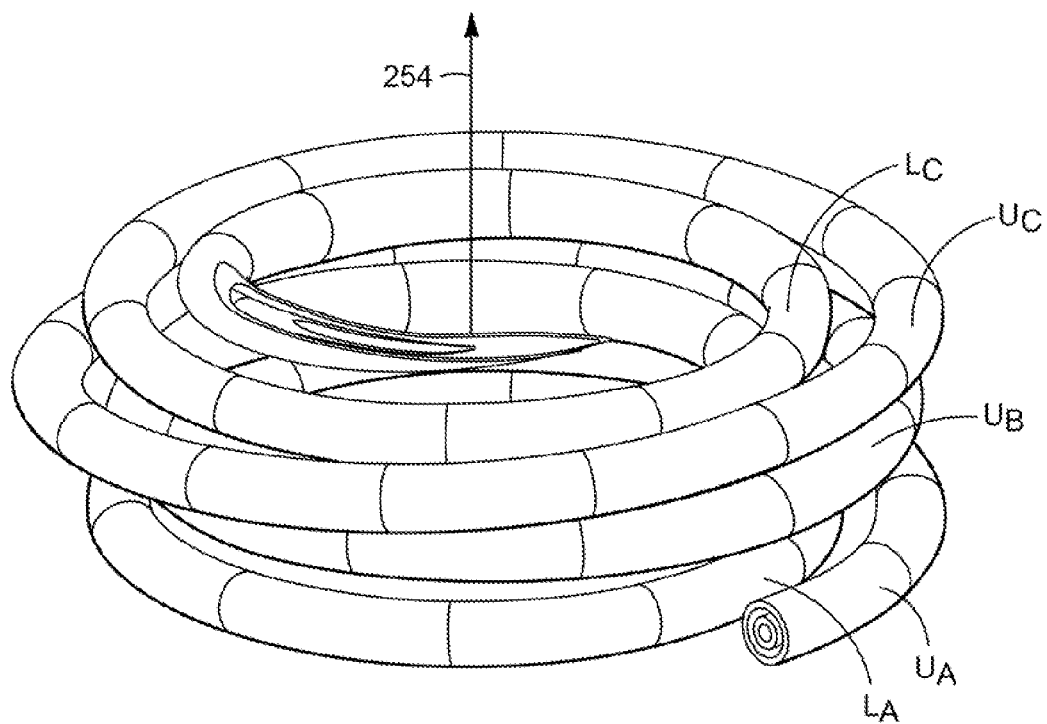

FIG. 2C represents the continuation of the ULLU winding pattern of FIGS. 2B and 2A, with a third multi-turn pair added. Again, $U_A$ and $L_A$ form the first multi-turn, and $L_B$ and $U_B$ form the adjacent multi-turn. $U_C$ represents the upper (outer) layer of the third multi-turn. $L_C$ represents the lower (inner) layer of the third multi-turn. In this example, the sequence is $U_AL_AL_BU_BU_CL_C$.

Figure 2D:
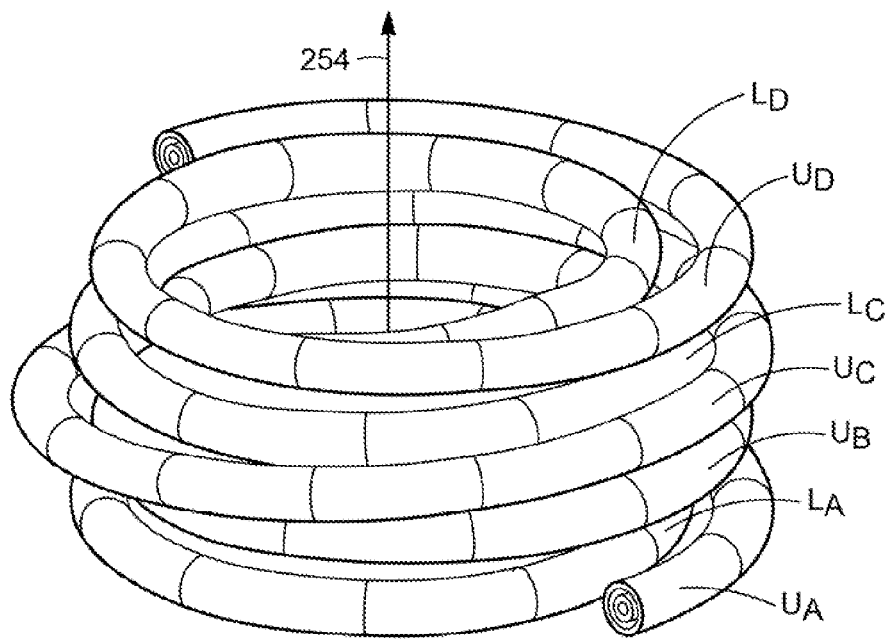

FIG. 2D represents the continuation of the ULLU winding pattern of FIGS. 2C, 2B, and 2A, with a fourth multi-turn added. Again, $U_A$ and $L_A$ form the first multi-turn, and $L_B$ and $U_B$ form the adjacent multi-turn. $U_C$ represents the upper (outer) layer of the third multi-turn. $L_C$ represents the lower (inner) layer of the third multi-turn. $L_D$ represents the lower (inner) layer of the fourth multi-turn. $U_D$ represents the upper (outer) layer of the fourth multi-turn. At this point, the pattern is $U_AL_AL_BU_BU_CL_CL_DU_D$.

As can be appreciated from FIG. 2D as well, the two ends of the coil are spatially separated such that they are at opposite ends of the coil linearly speaking (i.e., along the direction of arrow 254). This would not have been possible if the entire lower layer had been wound first, and then the winding had doubled back on top of the lower layer to form the upper layer (as was commonly done with transformer windings). Preferably (but not absolutely required), the two ends of the coil are at 180-degree with respect to one another (as shown in FIG. 2D) to maximize spatial separation.

As can be appreciated from the foregoing, embodiments of the invention effectively increase the number of turns without increasing the overall height of the coil (the height of the coil solenoid), which increases the inductance of the coil to effectively increase the induced voltage across the length of the coil while minimizing arcing. By increasing the induced voltage on the coil, plasma may be more easily ignited and/or sustained with the same or lower RF driver frequency.

Having disclosed exemplary embodiments and the best mode, modifications and variations may be made to the disclosed embodiments while remaining within the subject and spirit of the invention as defined by the following claims.

The invention claimed is:

1. An apparatus for generating plasma, comprising:
   a vessel within which said plasma is generated; and
   a coil configured to receive an RF driver signal to at least sustain said plasma, said coil being wound around a periphery of said vessel, said coil having a plurality of winding layers, said coil is constructed such that all winding layers of said plurality of winding layers are wound one on top of one another for a given multi-turn before an adjacent multi-turn is wound, said adjacent multi-turn being adjacent, in a direction parallel to an axis of said vessel, to said given multi-turn, wherein both said given multi-turn and said adjacent multi-turn are continuously wound in an uninterrupted manner from said coil such that said given multi-turn and said adjacent multi-turn form a continuous path.

2. The apparatus of claim 1 wherein said given multi-turn is wound from lowest layer of said given multi-turn to upper-most layer of said given multi-turn.

3. The apparatus of claim 2 wherein said adjacent multi-turn is wound from upper-most layer of said adjacent multi-turn to lowest layer of said adjacent multi-turn.

4. The apparatus of claim 2 wherein said adjacent multi-turn is wound from lowest layer of said adjacent multi-turn to upper-most layer of said adjacent multi-turn.

5. The apparatus of claim 1 wherein said vessel represents a plasma-generating cylinder of an atmospheric inductively coupled plasma torch.

6. The apparatus of claim 1 wherein said plurality of layers represent two layers.

7. The apparatus of claim 1 wherein said plurality of layers represent three layers.

8. The apparatus of claim 1 wherein said coil is implemented by one of a tube-in-a-tube configuration and a side-by-side tubing configuration.

9. The apparatus of claim 8 wherein a first end of said coil is coupled to ground, said first end also represents an end for injecting and extracting cooling fluid.

10. The apparatus of claim 1 wherein said RF driver signal has a frequency between about 10 MHz to about 100 MHz.

11. An atmospheric inductively coupled plasma torch configured for processing plasma substrates with plasma, comprising:
    a vessel within which said plasma is generated, said vessel having at least a first inlet for receiving a process gas and at least an open end for ejecting said plasma from said vessel, said vessel further includes a second inlet for receiving cooling gas and an outlet for removing said cooling gas; and
    a coil wound around a periphery of said vessel, said coil having at least two spaced-apart winding layers, said coil being constructed such that all winding layers of a given multi-turn is wound one on top of one another before an adjacent multi-turn is wound, said adjacent multi-turn being adjacent in a direction parallel to an axis of said vessel, to said given multi-turn, wherein both said given multi-turn and said adjacent multi-turn are continuously wound from said coil such that said given multi-turn and said adjacent multi-turn form a continuous current path, and wherein a first end of said coil is coupled to ground, a second end of said coil is coupled to receive a RF driver signal that is configured to ignite said plasma during said processing.

12. The atmospheric inductively coupled plasma torch of claim 11 wherein said given multi-turn is wound from lowest layer of said given multi-turn to upper-most layer of said given multi-turn.

13. The atmospheric inductively coupled plasma torch of claim 12 wherein said adjacent multi-turn continues from said upper-most layer of said given multi-turn and is wound from upper-most layer of said adjacent multi-turn to lowest layer of said adjacent multi-turn.

14. The atmospheric inductively coupled plasma torch of claim 12 wherein said adjacent multi-turn continues from said upper-most layer of said given multi-turn and is wound from lowest layer of said adjacent multi-turn to upper-most layer of said adjacent multi-turn.

15. The atmospheric inductively coupled plasma torch of claim 11 wherein said given multi-turn is wound from upper-most layer of said given multi-turn to lowest layer of said given multi-turn.

16. The atmospheric inductively coupled plasma torch of claim 15 wherein said adjacent multi-turn continues from said lowest layer of said given multi-turn and is wound from lowest layer of said adjacent multi-turn to uppermost layer of said adjacent multi-turn.

17. The atmospheric inductively coupled plasma torch of claim 15 wherein said adjacent multi-turn continues from said lowest layer of said given multi-turn and is wound from upper-most layer of said adjacent multi-turn to lowest layer of said adjacent multi-turn.

18. The atmospheric inductively coupled plasma torch of claim 11 wherein said coil is implemented by a tube-in-a-tube.

19. The atmospheric inductively coupled plasma torch of claim 11 wherein said driver RF signal has a driver RF frequency in the range of about 10 MHz to about 30 MHz.

20. An atmospheric inductively coupled plasma torch configured for processing plasma substrates with plasma, comprising:
    means for confining said plasma, said means having at least an inlet for receiving a process gas and at least an open end for ejecting said plasma;
    a coil wound around a periphery of said vessel, said coil having at least two spaced-apart winding layers, said coil being constructed such that all winding layers of a given multi-turn is wound one on top of one another before an adjacent multi-turn is wound, said adjacent multi-turn being adjacent in a direction parallel to an axis of said vessel, to said given multi-turn, wherein both said given multi-turn and said adjacent multi-turn are continuously wound in an uninterrupted manner from said coil such that said given multi-turn and said adjacent multi-turn form a continuous current path, and wherein a first end of said coil is coupled to ground; and
    means for generating a RF driver signal, said RF driver signal being provided to a second end of said coil during said processing.

* * * * *